United States Patent
Hasegawa

(10) Patent No.: US 7,745,928 B2
(45) Date of Patent: Jun. 29, 2010

(54) HEAT DISSIPATION PLATE AND SEMICONDUCTOR DEVICE

(75) Inventor: Tsuyoshi Hasegawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 12/164,396

(22) Filed: Jun. 30, 2008

(65) Prior Publication Data

US 2009/0008770 A1    Jan. 8, 2009

(30) Foreign Application Priority Data

Jul. 5, 2007    (JP) .............................. 2007-177636

(51) Int. Cl.
*H01L 23/34* (2006.01)

(52) U.S. Cl. ...................... 257/712; 257/700; 257/706; 257/707; 257/713; 257/720; 257/E33.075; 257/E31.131; 257/E23.051; 257/E23.106; 156/253

(58) Field of Classification Search ................ 257/276, 257/625, 675, 706, 707, 712–722, 796, E33.075, 257/E31.131, E23.051, E23.08–E23.113; 438/122, FOR. 413
See application file for complete search history.

(56) References Cited

U.S. PATENT DOCUMENTS

| | | | |
|---|---|---|---|
| 4,689,110 A * | 8/1987 | Leibowitz ..................... | 216/20 |
| 4,963,414 A | 10/1990 | LeVasseur et al. | |
| 5,156,923 A | 10/1992 | Jha et al. | |
| 5,224,017 A | 6/1993 | Martin | |
| 5,276,423 A * | 1/1994 | Breit et al. .................. | 338/308 |
| 5,306,571 A | 4/1994 | Dolowy, Jr. et al. | |
| 6,844,221 B2 * | 1/2005 | Viswanathan et al. ....... | 438/125 |
| 2006/0138655 A1 | 6/2006 | Takagi | |
| 2006/0249835 A1 | 11/2006 | Miyauchi | |
| 2007/0194440 A1 * | 8/2007 | Takashima et al. .......... | 257/706 |
| 2009/0072386 A1 | 3/2009 | Hasegawa | |

FOREIGN PATENT DOCUMENTS

| | | |
|---|---|---|
| DE | 196 05 302 A1 | 8/1997 |
| JP | 2001-313345 | 11/2001 |
| JP | 2005-277382 | 10/2005 |
| JP | 2006-1232 | 1/2006 |
| JP | 2006-13420 | 1/2006 |
| JP | 3862737 | 10/2006 |

OTHER PUBLICATIONS

U.S. Appl. No. 12/252,072, filed Oct. 15, 2008, Hasegawa.
U.S. Appl. No. 12/579,023, filed Oct. 14, 2009, Takagi et al.
U.S. Appl. No. 12/533,494, filed Jul. 31, 2009, Hasegawa.

* cited by examiner

*Primary Examiner*—Jasmine J Clark
(74) *Attorney, Agent, or Firm*—Oblon, Spivak, McClelland, Maier & Neustadt, L.L.P.

(57) ABSTRACT

A heat dissipation plate having a lamination of a copper layer, a molybdenum layer and a graphite layer, and outer copper layers each provided on a surface of the lamination, is disclosed. And also a semiconductor device using the heat dissipation plate is disclosed.

13 Claims, 5 Drawing Sheets

HEAT DISSIPATION PLATE AND SEMICONDUCTOR DEVICE

CROSS REFERENCE TO RELATED APPLICATION

This application is based upon and claims the benefit of priority from the Japanese Patent Application No. 2007-177636, filed on Jul. 5, 2007, the entire contents of which are incorporated herein by reference.

FIELD OF THE INVENTION

This invention relates to a heat dissipation plate used for a semiconductor package which encompasses a semiconductor element, such as various kinds of LSIs and ICs, and a semiconductor device using the heat dissipation plate.

DESCRIPTION OF THE BACKGROUND

Generally a semiconductor element generates more heat as output power goes up. To maintain the performance of the semiconductor element, a heat dissipation plate used for a semiconductor packages has various kinds of structures.

For example, Japanese laid-open patent application No. 2001-144237 discloses a graphite sheet lamination heat conductor combined with thin metal plates and graphite sheets, which is excellent in thermal conductivity as compared with a metal material. And a graphite sheet lamination heat conductor is proposed to radiate heat from an electronic device.

The above-mentioned graphite sheet lamination heat conductor can perform with high heat conduction characteristics. However, in case it is used in the semiconductor package with a ceramic substrate, a bonding part with the ceramic substrate may be damaged by a heat deformation, since the thermal expansion coefficient of the graphite sheet lamination heat conductor differs from greatly that of the ceramic substrate.

On the other hand, Japanese patent No. 3862737 discloses a material for a heat dissipation plate that brings the thermal expansion coefficient of the material close to that of a ceramic substrate, which constitutes a semiconductor element, by laminating copper layers and molybdenum layers alternately.

However, the heat-conduction efficiency of the above-mentioned material is not satisfactory. When an output power of the semiconductor element goes up and a heating value rises further, it becomes difficult to cope with the increase in heating value without increasing a heat dissipation area.

SUMMARY OF THE INVENTION

A heat dissipation plate is provided with a lamination of a copper layer, molybdenum layer and graphite layer and outer copper layers each provided on a surface of the lamination.

Also, a semiconductor device includes a heat dissipation plate, a semiconductor element having a semiconductor chip and substrate, a frame having open ends at opposite sides and an outer connecting terminal, a cover attached to the other open end of the frame member and a wire connecting the semiconductor element and the outer connecting terminal. The heat dissipation plate includes a lamination of copper layer, molybdenum layer and graphite layer, and outer copper layers provided on both surfaces of the lamination.

DETAILED DESCRIPTION OF THE INVENTION

The accompanying drawings, which are incorporated in and constitute a part of this specification, illustrate several embodiments of the invention and together with the description, serve to explain the principles of the invention.

A heat dissipation plate for a semiconductor package according to the embodiment includes a lamination of a copper layer and a graphite layer, and outer copper layers, each of the outer copper layers provided to both sides of the lamination.

Figure 1:
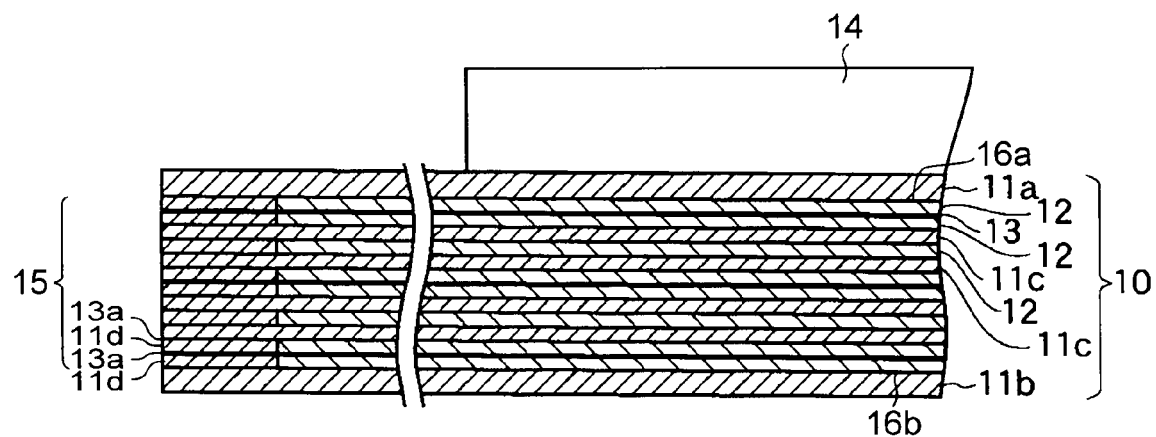
FIG. 1 is a cross-sectional view illustrating a main portion of a heat dissipation plate for a semiconductor package according to a first embodiment.
Figure 2:
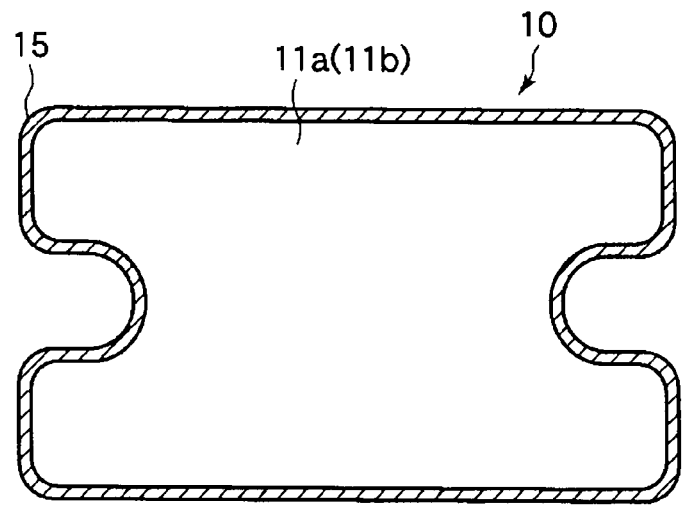
FIG. 2 is a plane view illustrating the plate shown in FIG. 1.

FIGS. 1 and 2 show a heat dissipation plate for a semiconductor device according to the first embodiment. FIG. 1 shows heat dissipation plate 10 on which semiconductor element 14 is mounted. Heat dissipation plate 10 has a flat plate structure having outer copper layers 11a, 11b at its both sides. Between outer copper layers 11a, 11b, for example, two sets of six layers of graphite layer 12, molybdenum layer 13, graphite layer 12, copper layer 11c, graphite layer 12 and copper layer 11c laminated in order, are laminated and further graphite layer 12, molybdenum 13 and graphite layer 12 are laminated in order on copper layer 12 of the second set of six layers. The graphite layer is excellent in thermal conductivity in a plane direction, and the copper layer is excellent in thermal conductivity in a direction vertical to a plane. That is, plural copper layers 11c, graphite layers 12, and molybdenum layers 13 are laminated alternately, and outer copper layers 11a, 11b are formed on both sides 16a and 16b of the lamination. Heat dissipation plate 10 has frame member 15, which is formed by laminating metal, for example, copper layer 11d and molybdenum layer 13a, at a periphery of the lamination, and each edge of graphite layer 12 is covered by frame member 15.

Copper layers 11c, graphite layers 12, molybdenum layers 13 and outer copper layers 11a, 11b are stacked in order as mentioned above, and are subjected to pressure and heating process, and, for example, a copper layer of 0.1 mm, graphite layer of 0.1 mm, molybdenum layer of 0.02 mm and outer copper layers 11a and 11b of 0.2 mm are laminated and integrated. An amount of molybdenum layers 13 is selected so that the thermal expansion coefficient of heat dissipation plate 10 becomes close to that of the ceramic substrate which constitutes the semiconductor element 14 mounted on heat dissipation plate 10. A ratio of a total thickness of outer copper layers 11a, 11b and copper layers 11c to a total thickness of graphite layers 12 is set as about 1.

Furthermore, copper layers 11d and molybdenum layers 13a are stacked at the periphery of the lamination and between outer copper layers 11a, 11b, and are subjected to pressure and heating process, thereby copper layers 11d and molybdenum layers 13a are laminated and frame member 15 is thus formed. Frame member 15 is simultaneously formed, when the lamination and outer copper layers are integrated.

A semiconductor device using the above mentioned heat dissipation plate according to the first embodiment will be explained. The semiconductor device includes a heat dissipation plate having a lamination of a copper layer, graphite layer and molybdenum layer, and outer copper layers provided on both surfaces of the lamination and a semiconductor element mounted on the heat dissipation plate. The semiconductor element includes a semiconductor chip and substrate. The semiconductor device further includes a frame having open ends at opposite sides and an outer connecting terminal. The frame member is attached to the heat dissipation plate and encompasses the semiconductor element. A cover is attached to the other open end of the frame member. A wire connects the semiconductor element and the outer connecting terminal.

Figure 3:
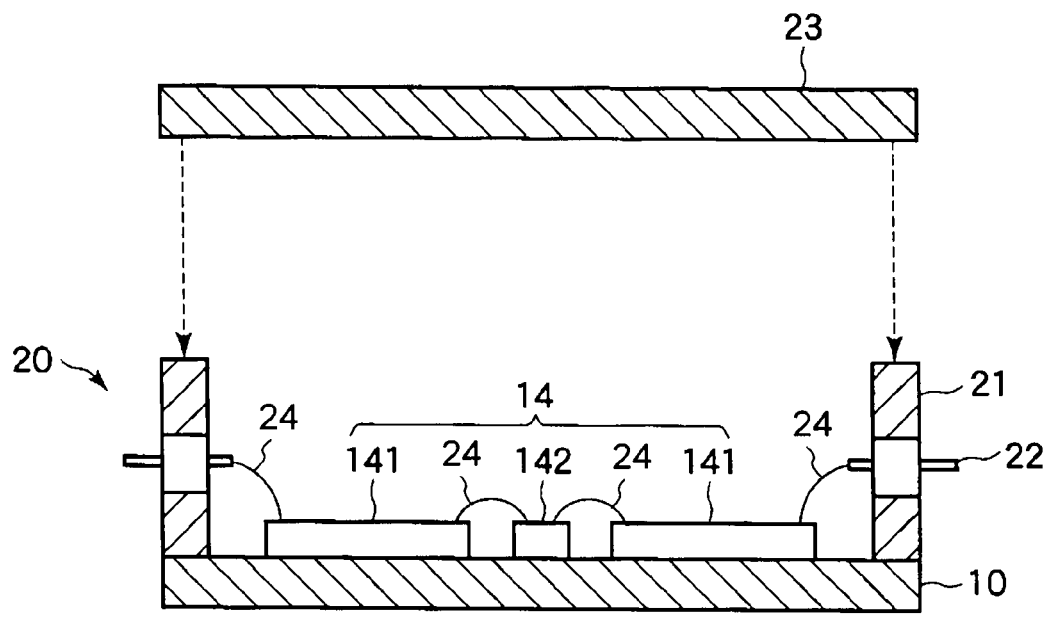
FIG. 3 is an exploded perspective view illustrating a semiconductor device according to a first embodiment.
Figure 4:
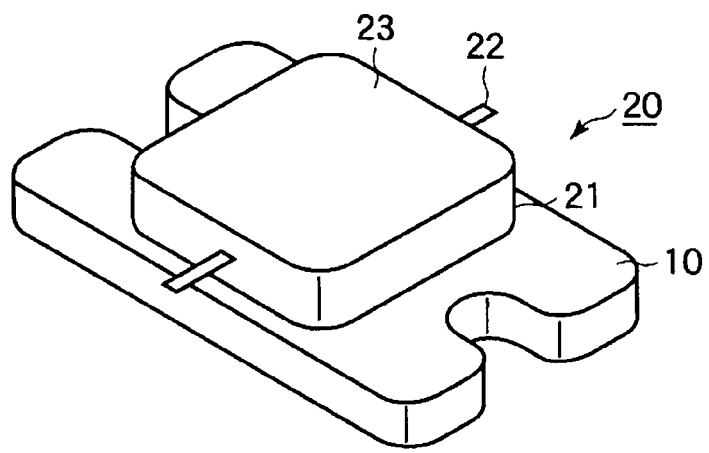
FIG. 4 is a perspective view including the semiconductor device shown in FIG. 3.

Semiconductor device 20 shown in FIGS. 3 and 4 is manufactured by preparing a treatment layer (not shown FIGS. 1 and 2) such as a gold plating, on outer surfaces of outer copper layers 11a, 11b, and frame member 15 of heat dissipation plate 10 shown in FIG. 1 and FIG. 2, and mounting semiconductor element 14 on the treatment layer.

As shown in FIG. 3, in the semiconductor device according to the first embodiment, frame 21 which constitutes the semiconductor package is attached on one of outer copper layers (not shown) of heat dissipation plate 10. Outer connection terminals 22 pass through frame 21. On heat dissipation plate 10 within frame 21, ceramic substrate 141 and semiconductor chip 142 of semiconductor element 14 are mounted and bonded by using solder etc. Ceramic substrate 141 and semiconductor chip 142 are electrically connected with mutual and outer connection terminals 22 by conductive wires 24. Cover 23 which constitutes a semiconductor package is attached to the open end of frame 21, and thus semiconductor device 20 shown in FIG. 4 is formed.

In the heat dissipation plate for semiconductor package according to the first embodiment and the semiconductor device according to the first embodiment, the thermal expansion coefficient of heat dissipation plate 10 is brought close to that of ceramic substrate 141 of semiconductor element 14 by the function of molybdenum layers 13. During bonding of ceramic substrate 141 to heat dissipation plate 10 using solder etc., even if there is a temperature change caused by heating and cooling a bonding portion, highly precise bonding is maintained without breaking ceramic substrate 141, since the thermal expansion coefficient of heat dissipation plate is brought close to that of ceramic substrate 141 and thermal deformations of heat dissipation plate 10 and ceramic substrate 141 become similar.

Furthermore, if semiconductor chip 142 on outer copper layer 11a of heat dissipation plate 10 operates and generates heat, first the heat will be transferred to outer copper layer 11a and then the heat will be transferred to ceramic substrate 141 via outer copper layer 11a. In this case, since thermal expansion coefficient of heat dissipation plate 10 is brought close to that of ceramic substrate 141 and heat deformations of heat dissipation plate 10 and ceramic substrate 141 are similar, highly precise bonding is maintained without breaking ceramic substrate 141.

Simultaneously, the heat transferred to heat dissipation plate 10 is efficiently conducted in a direction vertical to a plate surface by outer copper layers 11a, 11b, copper layers 11c and frame member 15, and the heat is efficiently conducted in a plane surface direction by graphite layer 12, and thereby the heat is conducted uniformly to the whole the heat dissipation plate 10. Accordingly, semiconductor element 14 on heat dissipation plate 10 is efficiently heat-controlled while keeping a high precise mounting between outer copper layer 11a and semiconductor element 14.

As such, damage of semiconductor element 14 mounted on heat dissipation plate 10, which is caused by the heat deformation, is prevented. Moreover heat dissipation plate 10 having outstanding thermally conductive ability is realized, and the efficient thermal control of semiconductor element 14 becomes possible.

This invention is not limited to above-mentioned embodiment, it is possible to constitute heat dissipation plates for semiconductor packages 10a, 10b, 10c, 10d, 10e, and 10f as shown in, for example, FIGS. 5, 6, 7, 8, 9 and 10, and the similar effective effect are obtained. Moreover, semiconductor devices can be manufactured using these heat dissipation plates. In the embodiment shown in FIGS. 5 through 10, the same numerals denote the same portions illustrated in FIGS. 1 through 4, and detailed explanations of those elements are omitted.

Figure 5:
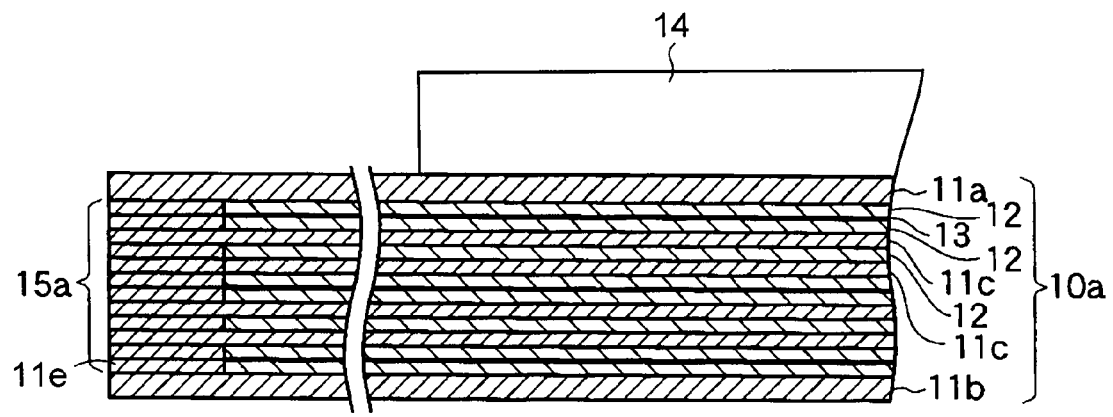
FIG. 5 is a cross-sectional view illustrating a main portion of a heat dissipation plate according to a second embodiment.

FIG. 5 shows a heat dissipation plate for a semiconductor package according to the second embodiment. In heat dissipation plate 10a, frame member 15a provided at a periphery is formed by laminating copper layers 11e, and the other portion is formed by laminating outer copper layers 11a, 11b, copper layers 11c, graphite layers 12 and molybdenum layers 13 alternately as well as the embodiment shown in FIG. 1.

Figure 6:
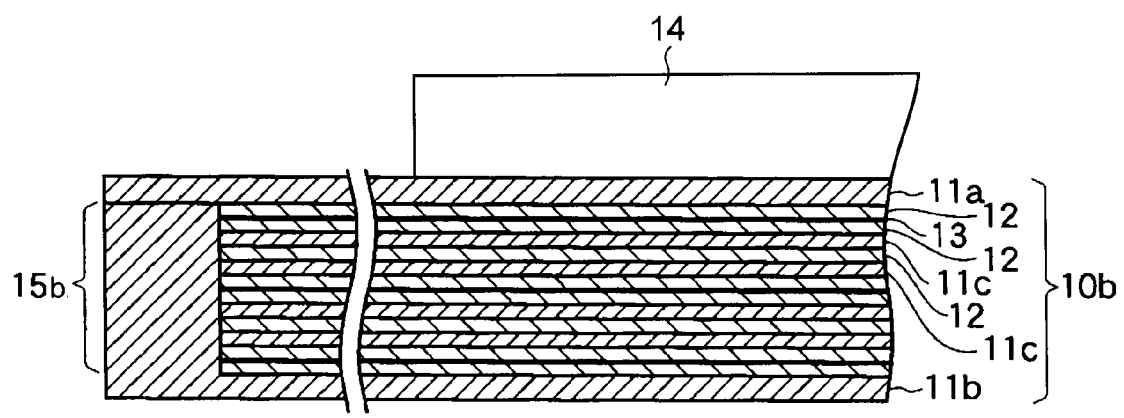
FIG. 6 is a cross-sectional view illustrating a main portion of a heat dissipation plate according to a third embodiment.

FIG. 6 shows a heat dissipation plate for a semiconductor package according to the third embodiment. In heat dissipation plate 10b, frame member 15b provided at a periphery is formed of copper, and frame member 15b and outer copper layer 11b are formed integrally.

Figure 7:
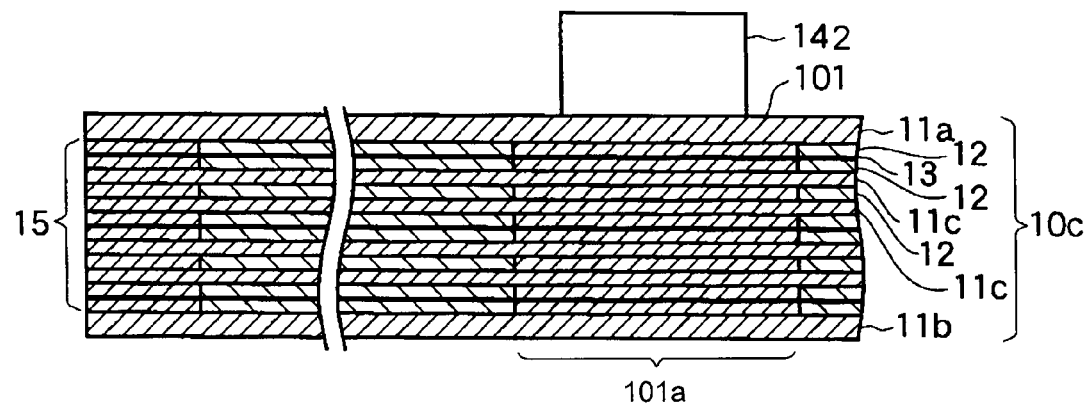
FIG. 7 is a cross-sectional view illustrating a main portion of a heat dissipation plate according to a fourth embodiment.

FIG. 7 shows a heat dissipation plate for semiconductor package according to the fourth embodiment. Heat dissipation plate 10c has semiconductor chip mounting portion 101a between outer copper layers 11a, 11b corresponding to area 101 which semiconductor chip 142 is mounted on, and semiconductor chip mounting portion 101a is formed by laminating copper layers 11c and molybdenum layers 13 without graphite layer 12. In semiconductor chip mounting portion 101a, the heat conductive ability in a direction vertical to a plane surface is improved by copper layer 11c and molybdenum layer 13 and a still better thermal conductivity is obtained. Thereby the heat from semiconductor chip 142, which heating value is concentrated in a semiconductor element, can be more efficiently transferred in the direction vertical to the plane surface.

Figure 8:
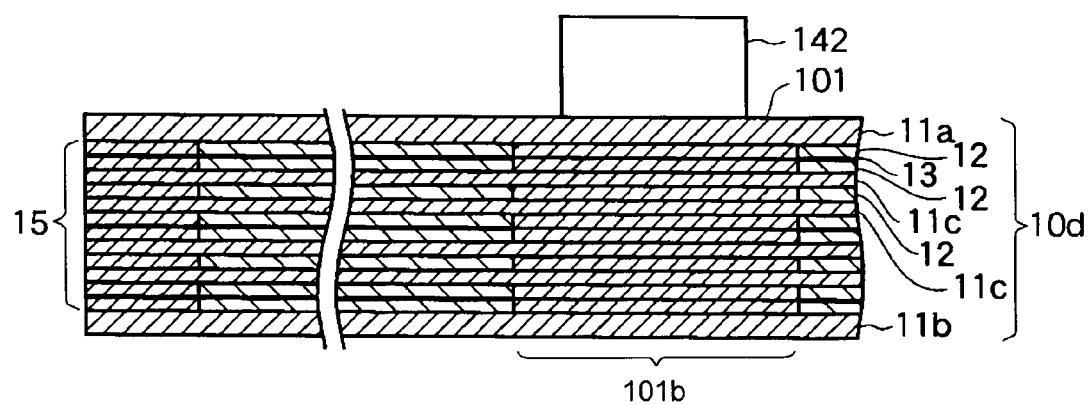
FIG. 8 is a cross-sectional view illustrating a main portion of a heat dissipation plate according to a fifth embodiment.

FIG. 8 shows a heat dissipation plate for a semiconductor package according to the fifth embodiment. In heat dissipation plate 10d, semiconductor chip mounting portion 101b is formed by laminating copper layers 11c only without graphite layer 12 and molybdenum layer 13. In semiconductor chip mounting portion 101b, a heat conductive ability in a direction vertical to the plane surface is improved. Thereby the heat from semiconductor chip 142, which heating value is concentrated in a semiconductor element 14, can be more efficiently transferred in the direction vertical to the plane surface.

Figure 9:
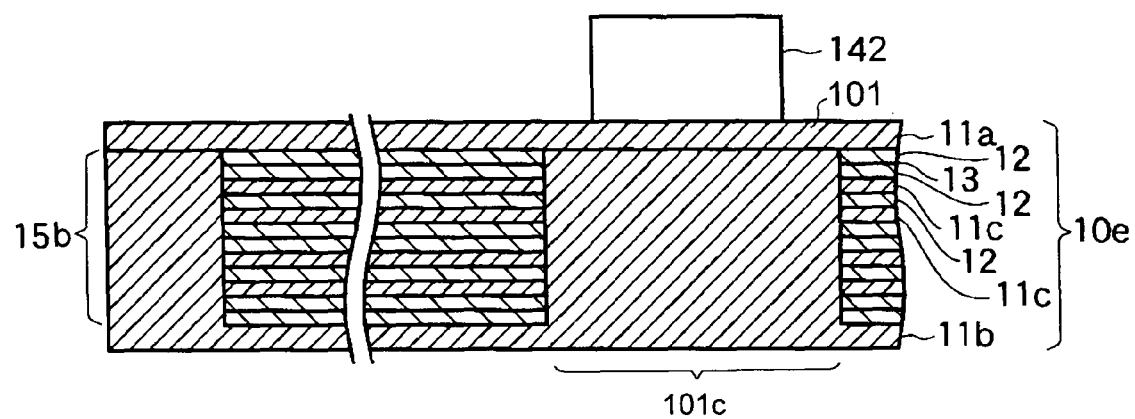
FIG. 9 is a cross-sectional view illustrating a main portion of a heat dissipation plate according to a sixth embodiment.

FIG. 9 shows a heat dissipation plate for a semiconductor package according to the sixth embodiment. In heat dissipation plate 10e, as well as heat dissipation plate 10b shown in FIG. 6, frame member 15b provided at the periphery is formed of copper only, and semiconductor chip mounting portion 101c is also formed of copper only. Frame member 15b, semiconductor chip mounting portion 101c and outer copper layer 11b are formed integrally. In this embodiment, semiconductor chip 142 is mounted on heat dissipation plate 10e as heat dissipation plate 10d shown in FIG. 8

Figure 10:
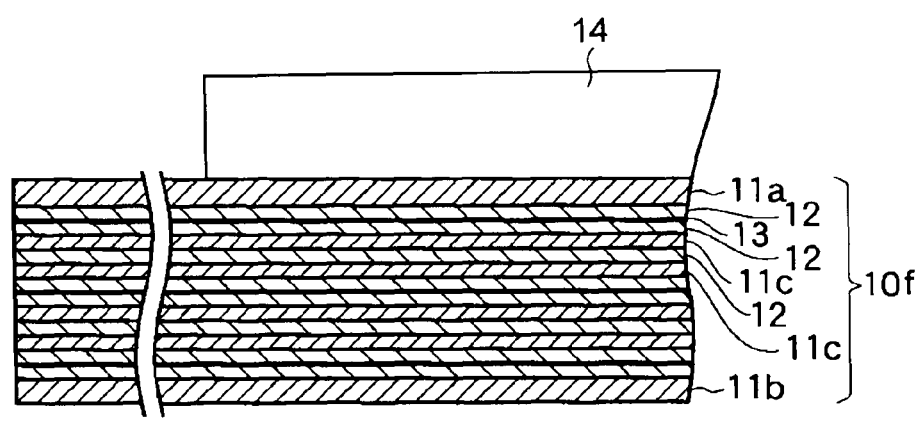
FIG. 10 is a cross-sectional view illustrating a main portion of a heat dissipation plate according to a seventh embodiment.

FIG. 10 shows a heat dissipation plate for a semiconductor package according to the seventh embodiment. Although the first embodiment shown in FIG. 1 has frame member 15, heat dissipation plate 10f according to this embodiment does not have frame member 15.

In the above-mentioned heat dissipation plates 10c, 10d and 10e, the cases in which one semiconductor chip mounting portion 101a, 101b, and 101c is formed are explained. However, the invention is not limited to those cases, it is also possible to provide semiconductor chip mounting portions at two or more places.

In each of the above-mentioned embodiments, the cases which each molybdenum layer 13 is sandwiched by graphite layers 12 are explained. However, the invention is not limited to those embodiments, and molybdenum layer 13 may be inserted between graphite layer 12 and copper layer 11c, between outer copper layer 11a (11b) and copper layer 11c, or between copper layers 11c.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A heat dissipation plate, comprising:
   a lamination of a copper layer, a molybdenum layer and a graphite layer; and
   outer copper layers, each provided on a surface of the lamination.

2. The heat dissipation plate according to claim 1, wherein a metal frame member is provided at a periphery of the lamination.

3. The heat dissipation plate according to claim 2, wherein the metal frame member is formed of copper.

4. The heat dissipation plate according to claim 2, wherein the metal frame member is formed of a combination of copper and molybdenum.

5. The heat dissipation plate according to claim 1, wherein the lamination has a plurality of layers including the copper layer, the graphite layer and the molybdenum layer laminated alternately.

6. The heat dissipation plate according to claim 3, wherein the metal frame member is integrally formed with one of the outer copper layers.

7. The heat dissipation plate according to claim 1, further comprising a semiconductor chip mounting portion provided between the outer copper layers corresponding to an area for a semiconductor element to be mounted on.

8. The heat dissipation plate according to claim 7, wherein the semiconductor chip mounting portion includes a lamination of copper layers.

9. The heat dissipation plate according to claim 7, wherein the semiconductor chip mounting portion is formed of copper and the semiconductor chip mounting portion is integrally formed with one of the outer copper layers.

10. The heat dissipation plate according to claim 7, wherein the semiconductor chip mounting portion includes a lamination of copper layers and molybdenum layers.

11. The heat dissipation plate according to claim 1, wherein the outer copper layer is thicker than the copper layer of the lamination.

12. The heat dissipation plate according to claim 1, wherein a ratio between a total thickness of the outer copper layers and the copper layer in the lamination, and a total thickness of the graphite layer is 1.

13. A semiconductor device, comprising:
   a heat dissipation plate having a lamination of a copper layer, a graphite layer and a molybdenum layer, and outer copper layers each provided on a surface of the lamination;
   a semiconductor element mounted on the heat dissipation plate, the semiconductor element having semiconductor chip and substrate;
   a frame having open ends at opposite sides and outer connecting terminal, the frame being attached to the heat dissipation plate at one open end and encompassing the semiconductor element;
   a cover attached to the other open end of the frame member; and
   a wire connecting the semiconductor element and the outer connecting terminal.

* * * * *